United States Patent
Waltari

(10) Patent No.: US 7,088,275 B2
(45) Date of Patent: *Aug. 8, 2006

(54) VARIABLE CLOCK RATE ANALOG-TO-DIGITAL CONVERTER

(75) Inventor: Mikko Waltari, San Diego, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/749,570

(22) Filed: Dec. 31, 2003

(65) Prior Publication Data

US 2005/0140536 A1    Jun. 30, 2005

(51) Int. Cl.
*H03M 1/12* (2006.01)
*H03L 7/06* (2006.01)
*G06F 1/04* (2006.01)
*G06F 1/06* (2006.01)
*G06F 1/08* (2006.01)

(52) U.S. Cl. ............... 341/155; 327/158; 713/500

(58) Field of Classification Search ............... 341/155, 341/120, 161, 163, 172; 327/94, 158, 415; 375/376; 713/500

See application file for complete search history.

(56) References Cited

U.S. PATENT DOCUMENTS

| | | | | |
|---|---|---|---|---|
| 3,781,871 A | * | 12/1973 | Mattern | 341/136 |
| 3,883,863 A | * | 5/1975 | Willard | 341/167 |
| 4,893,124 A | * | 1/1990 | Tsuji et al. | 341/156 |
| 4,983,970 A | * | 1/1991 | O'Donnell | 341/122 |
| 5,059,981 A | * | 10/1991 | Hauser | 341/164 |
| 5,212,486 A | | 5/1993 | Nagaraj | |
| 5,510,789 A | | 4/1996 | Lee | |
| 5,644,308 A | | 7/1997 | Kerth et al. | |
| 5,703,589 A | * | 12/1997 | Kalthoff et al. | 341/172 |
| 5,786,778 A | * | 7/1998 | Adams et al. | 341/61 |
| 5,796,358 A | * | 8/1998 | Shih et al. | 341/139 |
| 5,861,832 A | | 1/1999 | Nagaraj | |
| 5,875,218 A | * | 2/1999 | Barham et al. | 375/376 |

(Continued)

OTHER PUBLICATIONS

Krishnaswami Nagaraj, Senior Member; Efficient Circuit Configurations for Algorithmic Analog to Digital Converters; IEEE Transactions on Circuits and Systems-II: Analog and Digital Signal Processing; Dec. 1993; pp. 1-9; vol. 40, No. 12, no date.

*Primary Examiner*—Patrick Wamsley
(74) *Attorney, Agent, or Firm*—Hogan & Hartson, LLP

(57) ABSTRACT

An algorithmic analog-to-digital converter (ADC) includes a sample-and-hold circuit and an ADC processing unit operating in parallel and sharing a single operational amplifier. The ADC processing unit includes an MDAC with a switched capacitor topology and a sub-ADC. The ADC processing unit is clocked by an internal clock that is N times faster than the sample-and-hold clock. Each cycle is further sub-divided into two phases. During one phase the capacitors are coupled to a residue or sampled voltage provided by the MDAC, and during another phase the capacitor are coupled to a reference voltage determined by the switch control signals generated by the sub-ADC. A set of data bits is generated by the ADC processing unit during each ADC clock cycle. The N sets of data bits are added to generate the digital output stream. The internal clock, in turn, has a variable period allocating more time to the early operation phases where more accuracy is required and less time to the latter operation phases where less accuracy is required.

19 Claims, 13 Drawing Sheets

U.S. PATENT DOCUMENTS

| | | | |
|---|---|---|---|
| 5,886,562 A * | 3/1999 | Garrity et al. | 327/415 |
| 5,963,160 A * | 10/1999 | Wilson et al. | 341/143 |
| 6,097,326 A * | 8/2000 | Opris et al. | 341/161 |
| 6,154,164 A * | 11/2000 | Gross, Jr. | 341/163 |
| 6,154,165 A * | 11/2000 | Gross, Jr. | 341/164 |
| 6,195,032 B1 * | 2/2001 | Watson et al. | 341/162 |
| 6,362,835 B1 * | 3/2002 | Urbanus et al. | 345/692 |
| 6,486,820 B1 * | 11/2002 | Allworth et al. | 341/161 |
| 6,501,411 B1 * | 12/2002 | Soundarapandian et al. | 341/161 |
| 6,535,157 B1 | 3/2003 | Garrity et al. | |
| 6,541,952 B1 * | 4/2003 | Nagaraj | 324/76.42 |
| 6,570,519 B1 * | 5/2003 | Yang | 341/143 |
| 6,608,504 B1 * | 8/2003 | Fujimoto | 327/94 |
| 6,680,634 B1 * | 1/2004 | Ruha et al. | 327/158 |
| 6,700,523 B1 * | 3/2004 | Konno | 341/161 |
| 6,775,345 B1 * | 8/2004 | Song | 375/376 |
| 6,794,912 B1 * | 9/2004 | Hirata et al. | 327/158 |
| 6,826,247 B1 * | 11/2004 | Elliott et al. | 375/376 |
| 6,909,393 B1 * | 6/2005 | Atriss et al. | 341/163 |
| 6,927,722 B1 * | 8/2005 | Hong | 341/172 |

* cited by examiner

Cycle One
Phase One

Cycle One
Phase Two

Cycle Two
Phase Three

Cycle Two
Phase Four

Cycle Three
Phase Five

Cycle Three
Phase Six

Cycle Four
Phase Seven

Cycle Four
Phase Eight

Cycle Five
Phase Nine

Cycle Five
Phase Ten

| b | $q_{1p}$ | $q_{1z}$ | $q_{1m}$ | $q_{2p}$ | $q_{2z}$ | $q_{2m}$ | $q_{3p}$ | $q_{3z}$ | $q_{3m}$ | $d_2$ | $d_1$ | $d_0$ |
|---|---|---|---|---|---|---|---|---|---|---|---|---|
| 000000 | 0 | 0 | 1 | 0 | 0 | 1 | 0 | 0 | 1 | 0 | 0 | 0 |
| 000001 | 0 | 0 | 1 | 0 | 0 | 1 | 0 | 1 | 0 | 0 | 0 | 1 |
| 000011 | 0 | 0 | 1 | 0 | 1 | 0 | 0 | 1 | 0 | 0 | 1 | 0 |
| 000111 | 0 | 1 | 0 | 0 | 1 | 0 | 0 | 1 | 0 | 0 | 1 | 1 |
| 001111 | 1 | 0 | 0 | 0 | 1 | 0 | 0 | 1 | 0 | 1 | 0 | 0 |
| 011111 | 1 | 0 | 0 | 1 | 0 | 0 | 0 | 1 | 0 | 1 | 0 | 1 |
| 111111 | 1 | 0 | 0 | 1 | 0 | 0 | 1 | 0 | 0 | 1 | 1 | 0 |

| $d_2^I$ | $d_1^I$ | $d_0^I$ | | $d_2^{III}$ | $d_1^{III}$ | $d_0^{III}$ | | $d_2^V$ | $d_1^V$ | $d_0^V$ |
|---|---|---|---|---|---|---|---|---|---|---|
| | | | $d_2^{II}$ | $d_1^{II}$ | $d_0^{II}$ | | $d_2^{IV}$ | $d_1^{IV}$ | $d_0^{IV}$ | |
| $b_{10}$ | $b_9$ | $b_8$ | $b_7$ | $b_6$ | $b_5$ | $b_4$ | $b_3$ | $b_2$ | $b_1$ | $b_0$ |

VARIABLE CLOCK RATE ANALOG-TO-DIGITAL CONVERTER

RELATED APPLICATION

This application is related to the patent application entitled "Improved Architecture for an Algorithmic Analog-to-Digital Converter" by Mikko Waltari, filed on even date herewith and having common assignee.

FIELD OF THE INVENTION

The present invention relates to analog-to-digital converters and, in particular, relates to an improved clocking scheme for an algorithmic analog-to-digital converter.

BACKGROUND OF THE INVENTION

Analog-to-digital converters (ADCs) are in widespread use. Essentially, the ADC converts a continuous analog signal into discrete bits by sampling the continuous analog signal and quantizing it into a set of discrete levels. There are various types of ADCs, each having different cost and performance characteristics. Algorithmic ADCs (also known as "cyclic" or "recirculating" ADCs) operate by amplifying a signal to be converted and comparing the amplified signal to a reference voltage. If the amplified signal is greater than the reference voltage, then the most significant bit (MSB) of the output code is set to one, and the reference is subtracted from the amplified signal. If the amplified signal is less than the reference voltage, the MSB is set to zero and there is no subtraction operation. The remaining part of the amplified signal is called the "residue voltage". The residue voltage undergoes the same operation: it is amplified and compared to determine the next bit in the output code, and another residue voltage is developed. This process continues until the least significant bit (LSB) is obtained.

Because algorithmic ADCs perform a heavily serial operation using a simple circuit, they are area efficient and consume a low amount of power. The main disadvantage of algorithmic ADCs is their relatively long conversion cycle occasioned by its serial nature of operation. Typically, algorithmic ADCs use clock signals provided by a phase-locked loop (PLL) or crystal oscillator in which every clock pulse has an equal length. For applications such as video analog-to-digital conversion, having resolutions in the range of 7–14 bits and clock frequencies in the range of 20–50 MHz, this conversion cycle is too slow. Hence, algorithmic topologies have not been suitable for applications such as video ADCs having this speed and resolution range. Instead, other topologies such as pipeline topologies have been used.

SUMMARY OF THE INVENTION

The present invention provides an algorithmic ADC utilizing an internal clock period having variable cycles dedicating more settling time to those phases requiring more accuracy (e.g., MSB processing) and less settling time to those phases requiring less accuracy (e.g., LSB processing).

One embodiment of the invention is an algorithmic ADC comprising a sample-and-hold circuit clocked by a sampling clock having a substantially uniform clock period. An ADC processing unit is clocked by an internal ADC clock having at least two available cycles per sampling clock period, wherein at least one of the available cycles comprises a length different than a length of at least one of the other cycles. In one implementation, the variable internal clock period is provided by a DLL having at least two delay elements having differing amounts of delay.

Another embodiment of the invention is a method for converting an input analog signal to an output digital bit stream. An input analog signal is sampled and held during a sampling clock period, and at least two bits are generated using an algorithmic ADC unit clocked by an internal ADC clock having at least two cycles of variable length per sampling clock period.

Another embodiment of the invention is a method for reducing the conversion time of an algorithmic ADC comprising providing an internal ADC clock having a variable clock period.

Another embodiment of the invention is a clock generation system for an algorithmic ADC. The clock generation system comprises means for generating a sampling clock, and means for generating an internal ADC clock having N cycles per sampling clock period. The internal ADC clock cycles have variable length and are longer during operational phases proximate the MSB resolution and shorter during operational phases proximate the LSB resolution.

Another embodiment of the invention is a method for converting an input analog signal to an output digital bit stream. The method comprises a step for sampling and holding the input analog signal during a sampling clock period; a step for generating an ADC clock having N cycles of variable length per sampling clock period; a step for generating an intermediate analog voltage per cycle using the sampled analog signal and residue voltages derived from the sampled analog signal; a step for generating a set of data bits per cycle from the intermediate analog voltage; a step for generating feedback signals for generating the intermediate analog voltage in the next cycle; and a step for generating the output digital bit stream using the N sets of data bits.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION OF THE INVENTION

The present invention provides an algorithmic analog-to-digital converter (ADC) having an improved area efficiency and a conversion rate suitably high for high speed and bit resolution applications such as video ADC. It is area efficient because it contains only one processing unit and has a heavily serial operation principle. By contrast, existing algorithmic ADCs have at least two processing units. The higher conversion rate is achieved by processing multiple bits in each cycle. The processing unit, which employs a switched capacitor topology, resembles a multi-bit stage in a pipelined ADC.

The present application is directed primarily to the "Improved Clocking Scheme" described toward the end of this document. The improved clocking scheme may be utilized in the improved architecture described below, or in any other algorithmic ADC architecture.

Overview

Figure 1:
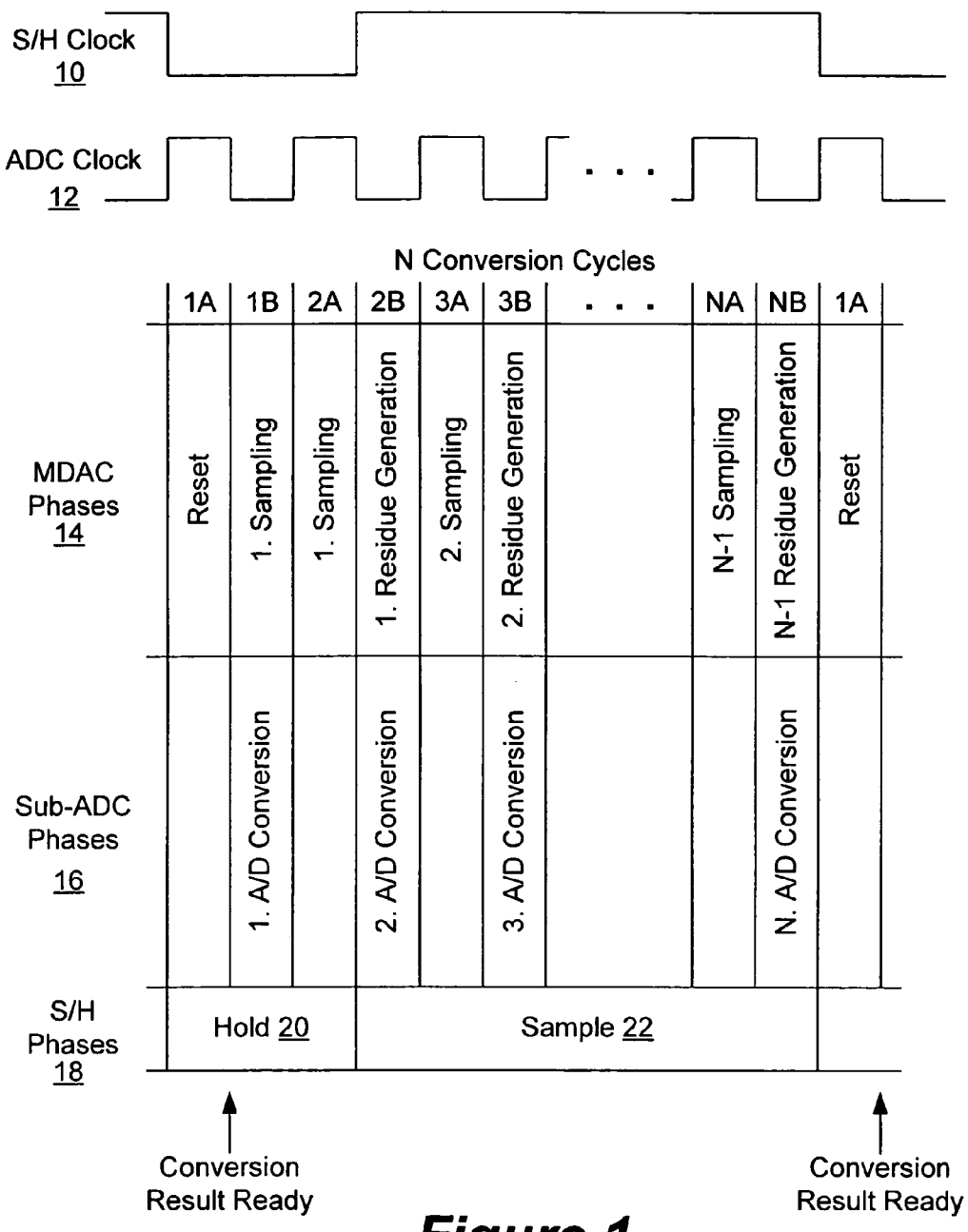
FIG. 1 is a diagram illustrating clocks, conversion cycles and phases according to the present invention.

The architecture comprises a sample-and-hold circuit and a multi-bit serial ADC processing unit (the processing unit, in turn, comprises a multiplying digital-to-analog converter (MDAC) and a sub-ADC). These two circuits work in parallel and share a single operational amplifier. As depicted in FIG. 1, the sample-and-hold circuit works at the sampling rate with uneven duty cycle (S/H clock 10), while the processing unit (MDAC and sub-ADC) operates at a faster rate: N (an integer) times the sampling rate (ADC clock 12). In one period of S/H clock 10, analog-to-digital conversion is carried out in N cycles, each cycle yielding k effective bits plus one redundant bit. The redundant bit is used to correct comparator errors using a digital algorithm. In one implementation, the redundant sign digit (RSD) algorithm is used. After the N cycles, the N*K+1 bit analog-to-digital conversion result is formed using the sub-conversion results in a process analogous to the process used in pipelined analog-to-digital converters.

Figure 2A:
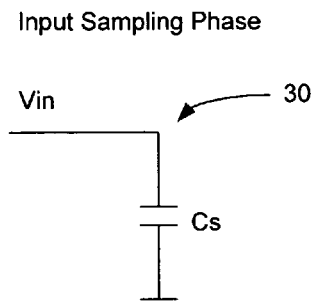
FIG. 2a is a diagram of a sample-and-hold circuit according to the present invention during a sample phase.
Figure 2B:
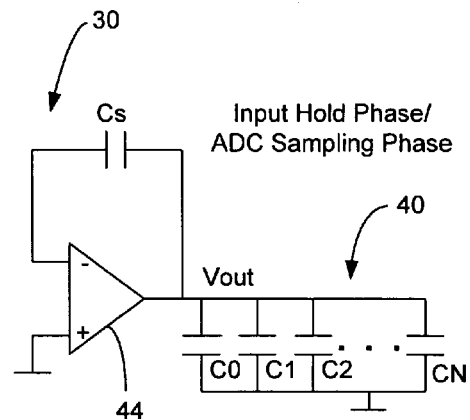
FIG. 2b is a diagram of a sample-and-hold circuit according to the present invention during a hold phase.

N clock cycles 1–N are depicted in FIG. 1. Each clock cycle, in turn, is divided into two phases. Hence, cycle 1 consists of phases 1A and 1B, and so on. FIG. 1 depicts generally the events that occur in the sample-and-hold circuit (S/H phases 18) and the processing unit (MDAC phases 14 and sub-ADC phases 16) with respect to the cycles and phases defined by S/H clock 10 and ADC clock 12. The operation of the sample-and-hold circuit consists of two phases: a hold phase 20 and a sample phase 22. Operation of sample-and-hold circuits for sample phase 22 and hold phase 20 are depicted in FIGS. 2a and 2b. During the input sampling phase 2B-NB, FIG. 2a, sample-and-hold circuit 30 takes a sample of the input voltage Vin, continually charging capacitor Cs to the sample voltage during that phase. In the hold phase 1B-2A, FIG. 2b, sample-and-hold circuit 30 buffers this sample voltage and loads it to the switched capacitors of the MDAC.

Figure 3A:
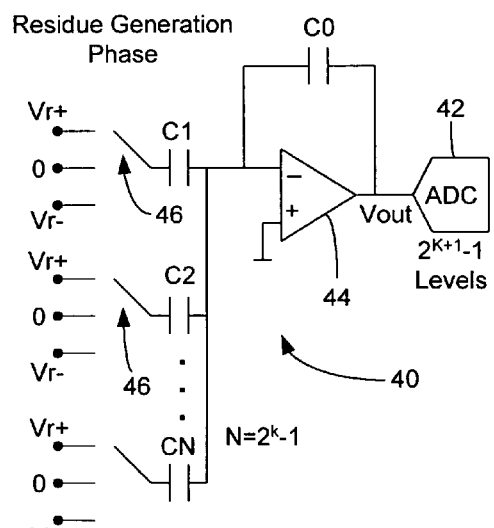
FIG. 3a is a diagram of an MDAC circuit according to the present invention during a residue generation phase.

As noted above, the ADC processing unit comprises an MDAC and a sub-ADC. MDAC 40 (FIGS. 3a–b) is typically a switched capacitor (SC) circuit comprising an operational amplifier (op amp) 44, N ($=2^k$) nominally equal capacitors C1 ... CN, and a number of switches 46 that are controlled by the ADC result from the previous cycle. For clarity, many of the switches are not shown. Sub-ADC 42 can be any type of low latency ADC, such as a flash ADC. Connection of the capacitors of MDAC 40 and the sub-ADC 42 in the residue generation phases 2B, 3B ... NB is depicted in FIG. 3a, and connection of the MDAC capacitors in the sample phases 2A, 3A ... NA is depicted in FIG. 3b.

When the residue generation phase begins (FIG. 3a), all capacitors are charged to the same voltage Vin, which is either the previous residue voltage or, in the case of phase 2B, the new sample voltage provided by the sample-and-hold circuit. The conversion result generated by sub-ADC 42 in the previous B phase is used to control the switches 46 on the left side of capacitors C1, ..., CN. By means of switches 46, each of capacitors C1, ..., CN is connected to one of three reference voltages (Vr+, 0 or Vr−) according to the control code provided by sub-ADC 42. The resulting charge redistribution forms a residue voltage $$Vout = 2^k \cdot Vin - \sum_{n=1}^{2^k-1} Vrn$$

at the output of op amp 44. Sub-ADC 42 then samples the new residue voltage and begins ADC, which provides the switch control signals for the next cycle as well as the sub-conversion result later used to form the ADC output code.

Figure 3B:
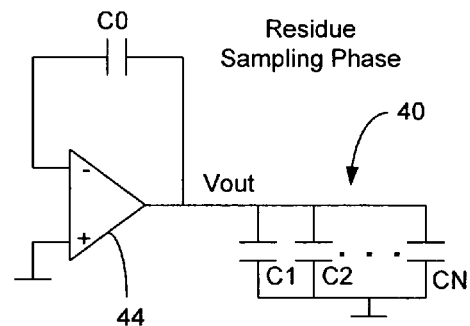
FIG. 3b is a diagram of an MDAC circuit according to the present invention during a sample phase.

Residue sampling phase 40, depicted in FIG. 3b, loads all capacitors to the new residue voltage which is still memorized in capacitor C0.

EXEMPLARY EMBODIMENT

Figure 4:
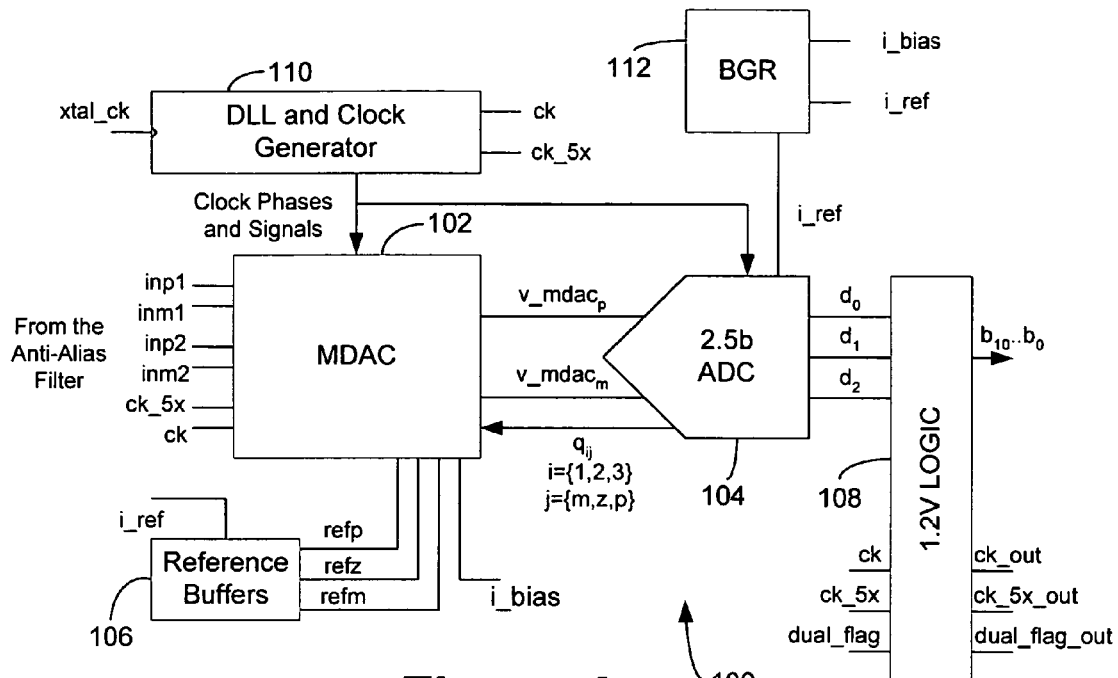
FIG. 4 is a block diagram of an algorithmic ADC architecture according to the present invention.

FIG. 4 is a block diagram of an 11-bit advanced video ADC 100 implementing an algorithmic architecture and using switched capacitor techniques, as described above. It should be understood that ADC 100 is just one implementation example of the principles of the present invention; many other implementations are possible and envisioned.

ADC 100 comprises an MDAC 102; a 2.5-bit parallel ADC 104; reference buffers (3) 106; digital error correction logic 108; and delay-locked loop (DLL) 110. BGR (bandgap reference) 112 is also provided for generating the on-chip reference currents for the reference buffers, the OTA, the 2.5-bit ADC and the DLL. Alternatively, reference voltages could be used. ADC 100 may be implemented in, for example, a video encoder or decoder, a set-top box, a television tuner, a computer, or in any other environment in which conversion of analog to digital signals is required. In one implementation, video ADC receives analog input from an anti-aliasing filter (not shown), and provides a digital output stream for further processing.

Figure 6:
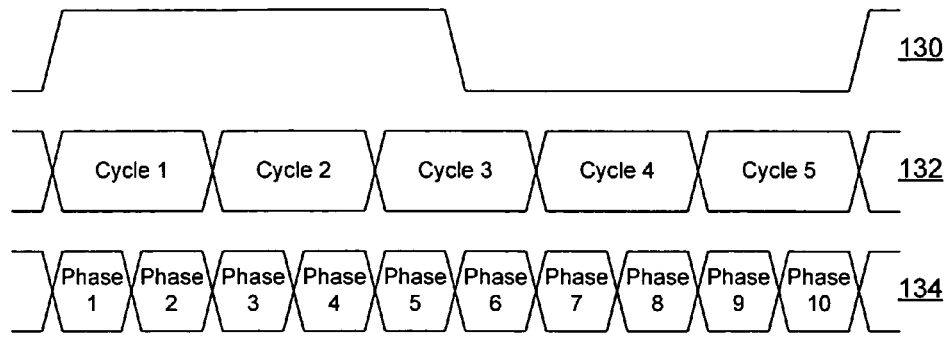
FIG. 6 is a timing diagram showing the relation between the system clock and internal clock cycles and phases.

ADC 100 uses an internal clock that is five (or some other integer N) times faster than the sampling XTAL clock. In one implementation, the maximum frequency of the XTAL clock is 29.5 MHz. One period of a sampling XTAL clock signal 130 is depicted in FIG. 6. DLL 110 multiplies the input XTAL clock frequency (xtal_ck) by five to result in the ADC clock output ck_5x, having a maximum frequency of 147.5 MHz. FIG. 6 depicts an ADC clock output signal 132. As can be seen, one period of sampling clock 130 corresponds to five periods or cycles of ADC clock 132. Moreover, as described below, each period of ADC clock 132 is divided into two phases for a total of ten phases (see, e.g., signal 134 comprising ten phases). One conversion is completed in one sampling clock period, or in five ADC clock cycles, or in ten phases.

Figure 5:
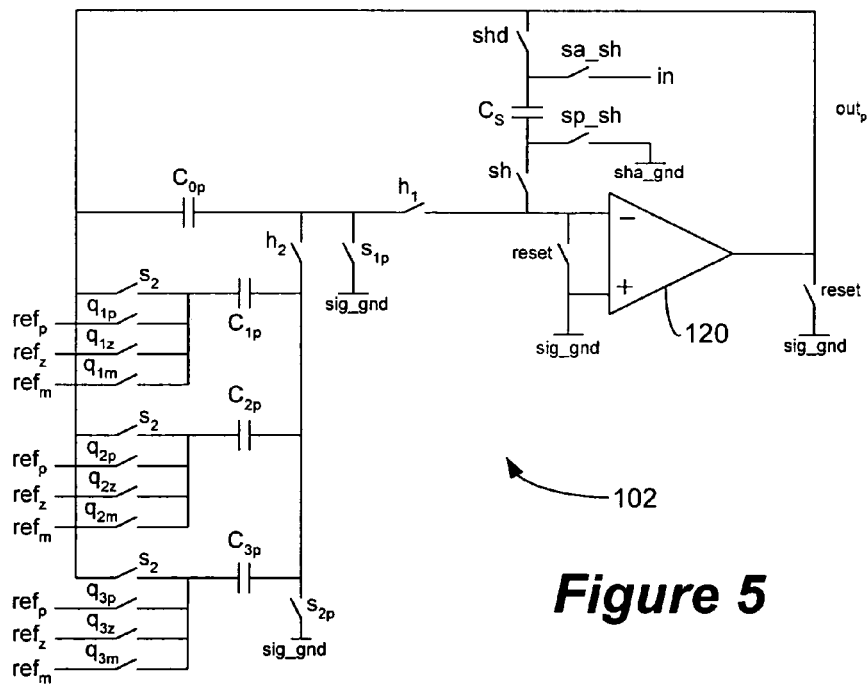
FIG. 5 is a diagram of an MDAC-circuit according to the present invention.

MDAC 102 is illustrated in more detail in FIG. 5. MDAC 102 comprises a high-performance fully-differential operational transconductance amplifer (OTA) 120, sampling capacitor $C_s$, capacitors $C_{\{0,1,2,3\}p}$, a plurality of switches and two buffers 122 and 124. In one implementation, op amp 120 has a folded-cascoded topology. This topology is preferable because it is suitable for driving capacitive loads and allows large input common-mode range, wide output swing, high output impedance and high unity-gain frequency. In order to simplify the description, a single-ended version of MDAC 102 is illustrated. It should be understood, however, that fully differential operation is envisioned. FIG. 4, for example, depict differential inputs to MDAC 102 and sub-ADC 104.

Now, the various switches and their configurations will be described. The purpose of this configuration will become more apparent during the description of FIGS. 7a–7j. Capacitors $C_{\{1,2,3\}p}$ are connected on their left ends to the output of op amp 120 if switch s2 is closed, or to a reference voltage $\text{ref}_{\{p,m,z\}}$ if one of switches $q_{\{1,2,3\}\{p,z,m\}}$ is closed. Capacitors $C_{\{1,2,3\}p}$ are connected on their right ends to ground if switch $s_{2p}$ is closed, or to the right end of capacitor $C_{0p}$ if switch $h_2$ is closed. Capacitor $C_{0p}$ is connected on its left end to the output of op amp 120. On its right end, capacitor $C_{0p}$ is connected to the right ends of capacitors $C_{\{1,2,3\}p}$ if switch $h_2$ is closed; to ground if switch $s_{1p}$ is closed, or to the negative input of op amp 120 if switch $h_1$ is closed.

The sampling capacitor $C_s$ is connected at its bottom end to the negative input of op amp 120 if switch sh is closed, or to ground if switch sp_sh is closed. The top end of capacitor $C_s$ is connected to the output of op amp 120 if switch shd is closed, or to the signal in if switch sa_sh is closed. Sampling circuit Cs and its associated switches forms the "sample-and-hold" circuit portion described above in the overview, and operates in parallel with MDAC 102 and sub-ADC 104 as dictated by the positions of the adjacent switches.

The positive input to op amp 120 is connected to ground and couples the ground signal to the negative input as well if the reset switch is closed. The negative input to op amp 120 is connected to ground if the reset switch is closed, to the right end of capacitor $C_{0p}$ if switch $h_1$ is closed, or to the bottom end of capacitor $C_s$ if switch sh is closed. The output of op amp 120 is connected to the left ends of capacitors $C_{\{1,2,3\}p}$ if switches $s_2$ are closed, to sampling capacitor $C_s$ if switch shd is closed, or to ground if the reset switch is closed.

MDAC 102 is the most critical block of video ADC 100. It performs digital-to-analog conversion of the output of the sub-ADC, subtracts the resulting analog signal from the sampled and held input signal, and amplifies the residue. MDAC 102 is implemented using the switched capacitor (SC) technique; its core is essentially a SC integrator formed around an operational amplifier. Using the conservation of charge at the input node of op amp 120, the output voltage can be computed as:

$$V_{out} = \left(1 + \frac{k}{1 + \frac{k}{A_o}}\right) \cdot v_{in} - \frac{k}{1 + \frac{k}{A_o}} \cdot v_{dac}$$

where $$k = \frac{C_1 + C_2 + C_3}{C_0},$$

$A_0$ is the DC gain of op amp 120, $V_{dac}$ is the output of MDAC 102:

$$v_{dac} = \frac{1}{C_0} \cdot \sum_{i=1}^{3} C_i v_i$$

and $v_i$ is equal to either the positive-, negative- or zero-reference voltage according to table 10 (applied to capacitors $C_{\{1,2,3\}p}$ via the input switches). As will be described below, these quantities are available to MDAC 102 at the ends of phases four, six and eight. It is also available at the end of phase ten, but is discarded when a new sample begins processing.

The output of MDAC 102 is provided to sub-ADC 104 which, in turn, generates five triplets of output bits $d_{\{0,1,2\}}$ over one sampling period (i.e. over five cycles or ten phases) and corresponding sets of control signals $q_{\{1,2,3\}\{p,z,m\}}$. The five triplets of output bits $d_{\{0,1,2\}}$ are added as will be described to generate the 11-bit digital output stream $b_{\{0\text{-}10\}}$ of ADC 100, while the control signals $q_{\{1,2,3\}\{p,z,m\}}$ are fed back to MDAC 102 to control the operation of the corresponding switches on the left ends of capacitors $C_{\{1,2,3\}p}$ to couple the capacitors to the appropriate reference voltages at the appropriate time.

In one implementation, sub-ADC 104 is a flash ADC. The details of its operation will be described in detail below.

First, with reference to FIGS. 7a–7j, the operational state of MDAC 102 during each of the ten phases (corresponding to the ten phases of signal 134 in FIG. 6) will be described. In the descriptions of FIGS. 7a–7j, where a switch and a circuit component are not depicted, this means that the switch is in an open state and adjacent (non-depicted) components have been removed from the circuit.

Figure 7A:
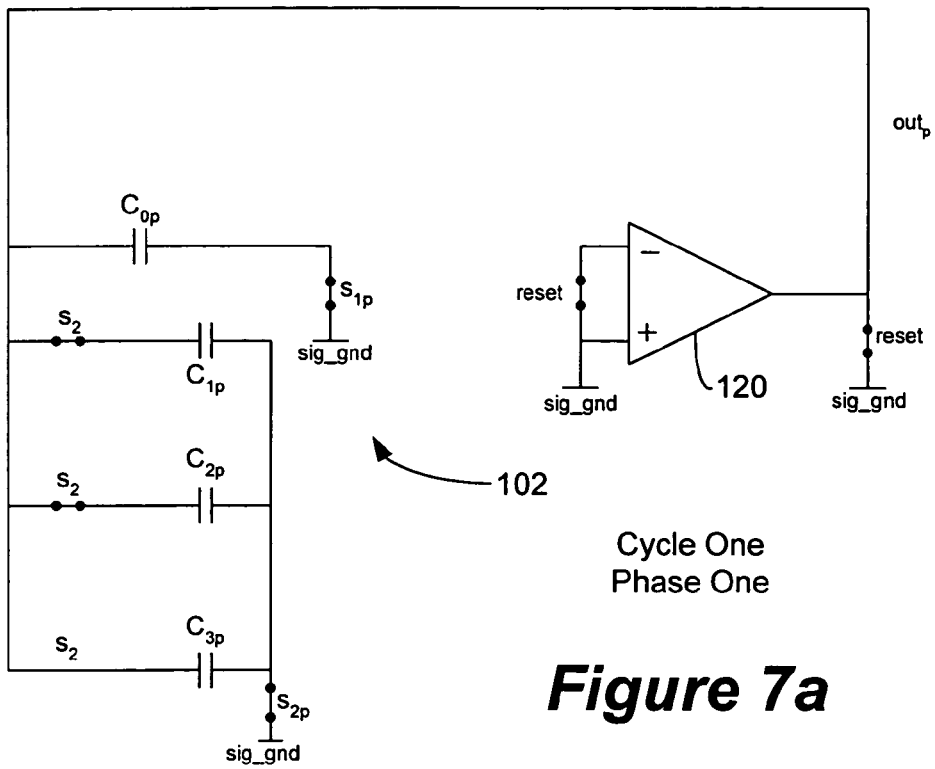
FIG. 7a is a diagram showing the configuration of the MDAC circuit of FIG. 5 during cycle one, phase one.

FIG. 7a depicts cycle one, phase one. During phase one, the input and output nodes of op amp 120 are reset by closing the reset switches. Phase one cancels any memory effects due to the input parasitic capacitance of op amp 120. Capacitors $C_{\{0,1,2,3\}p}$ are also coupled to ground by the closures of switches $s_2$, $s_{2p}$ and $s_{1p}$. Switches shd, sa_sh, sp_sh and sh are open to remove capacitor $C_s$, which remains charged to the sample voltage obtained during phases 5–9 of the previous resolution cycle, from the circuit. At the end of phase one, the fifth output triplet of digital bits $d_{\{0,1,2\}}^V$ is generated by sub-ADC 104 and, accordingly, the final 11-bit output digital stream b[10:0] of the conversion cycle can be generated by ADC 100. As will be described in more detail with reference to the description of sub-ADC 104, the output digital stream b[10:0] is ready during the middle of phase two. The feedback signals $q_{\{1,2,3\}\{p,z,m\}}$ are also available from sub-ADC 104, but are not needed and are discarded.

Figure 7B:
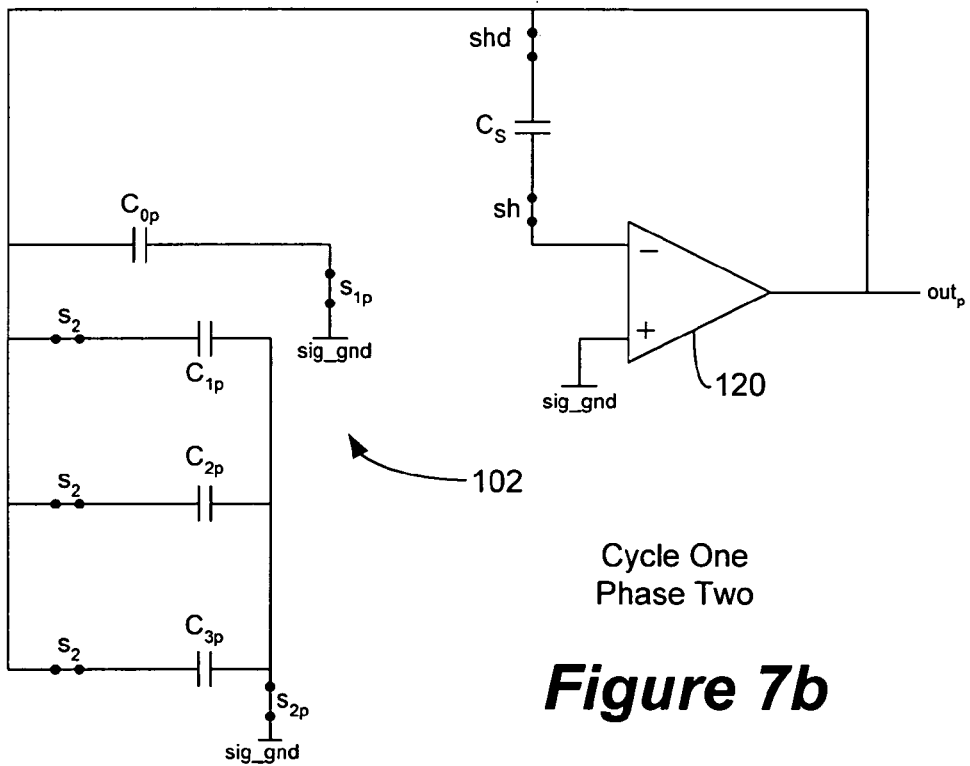
FIG. 7b is a diagram showing the configuration of the MDAC circuit of FIG. 5 during cycle one, phase two.

FIG. 7b depicts cycle one, phase two. During phase two, the sampled input voltage held by capacitor $C_s$ is buffered via the closure of switches sh and shd, causing capacitors $C_{\{0,1,2,3\}p}$ to be charged to the sampled voltage. Sub-ADC 104 is coupled to and samples the output of MDAC 102.

Figure 7C:
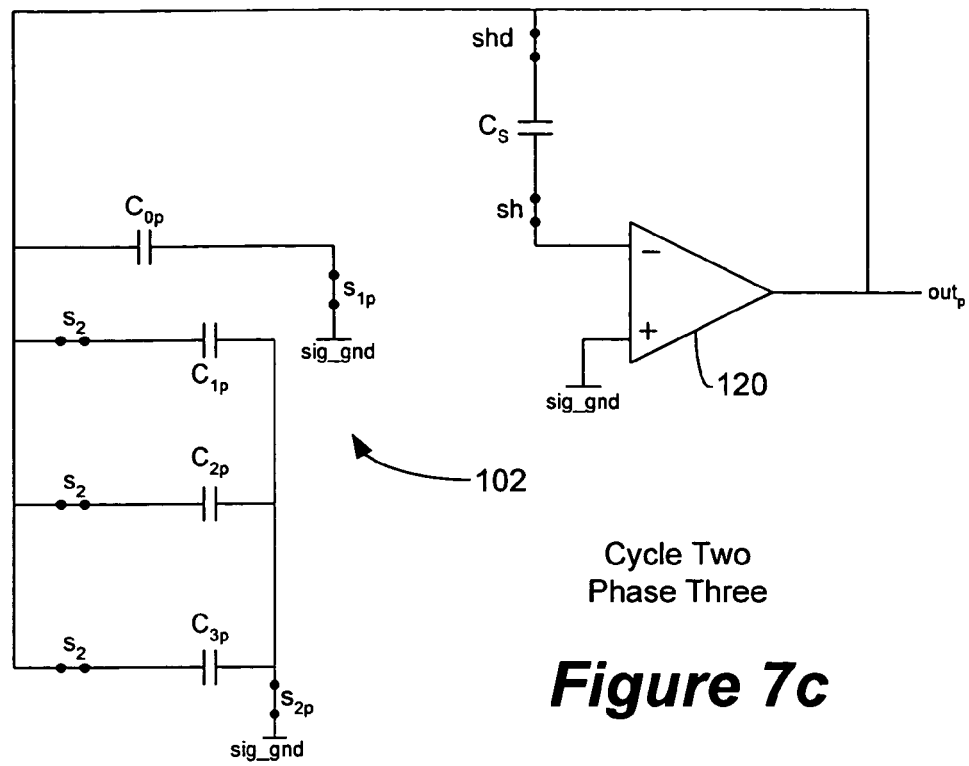
FIG. 7c is a diagram showing the configuration of the MDAC circuit of FIG. 5 during cycle two, phase three.

FIG. 7c depicts cycle two, phase three. The configuration of MDAC 102 during phase two is the same as it was during phase three. The output of the sub-ADC comparators is latched at the beginning of phase three, and sub-ADC 104 generates the first output triplet of digital bits $d_{\{0,1,2\}}^I$ as well as feedback signals $q_{\{1,2,3\}\{p,z,m\}}$ at the end of phase three.

Figure 7D:
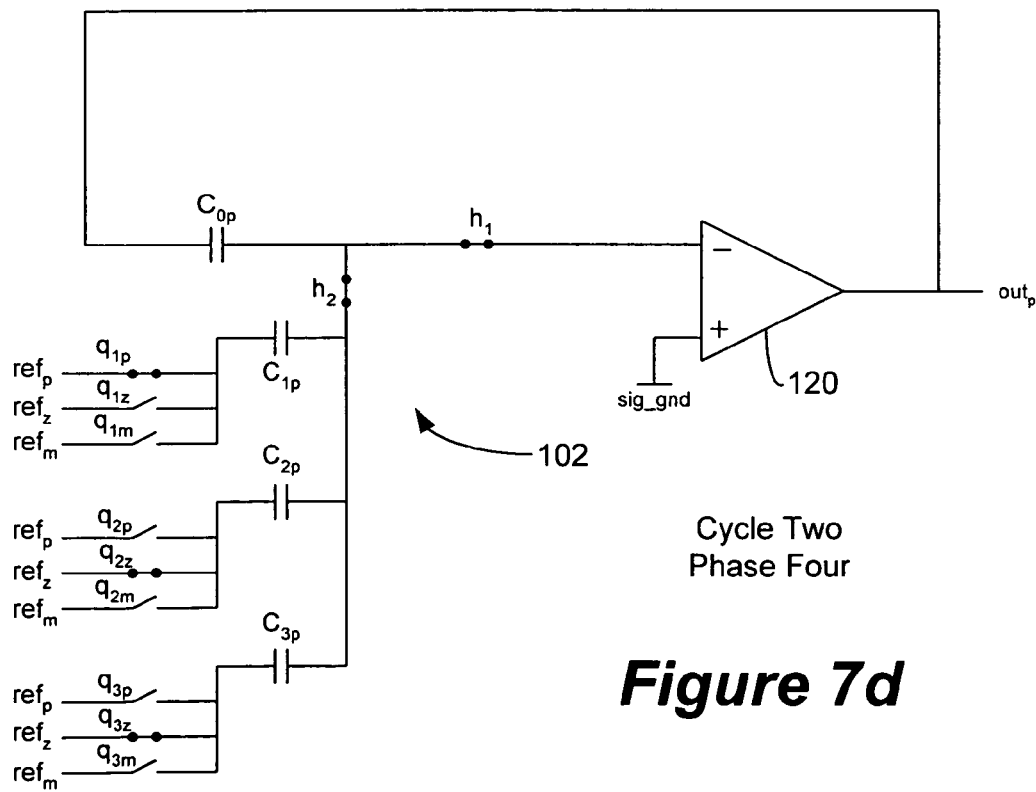
FIG. 7d is a diagram showing the configuration of the MDAC circuit of FIG. 5 during cycle two, phase four.

FIG. 7d depicts cycle two, phase four. Switches $s_2$ are opened to remove the sampled voltage from capacitors $C_{\{1,2,3\}P}$, and the right ends of capacitors $C_{\{1,2,3\}P}$ are coupled to the negative input of op amp 120 via the closure of switches $h_2$ and $h_1$ (and opening of switches $s_{2p}$ and $s_{1p}$). The sampled voltage carried by capacitor $C_s$ is removed from the circuit by the opening of switches shd and sh, and capacitor $C_0$ is coupled between the output and input of op amp 120 by the closure of switch $h_1$ and opening of switch $h_2$.

Also in phase four, according to feedback signals q, the appropriate reference buffers are coupled to capacitors $C_{\{1,2,3\}P}$. In this regard, it should be understood that capacitors $C_{\{1,2,3\}P}$ are not necessarily coupled to the three reference buffers by three separate switches (e.g., switches $q_{1\{p,z,m\}}$ as depicted). For instance, the control signals q could control the operation of just one switch coupled to the inputs of each of capacitors $C_{\{1,2,3\}P}$ to couple the capacitors to the appropriate reference buffer (as determined by the control signals q). In one implementation, the reference buffer voltages $ref_p$, $ref_z$ and $ref_m$ are created by sending a reference current (25 μA) through a resistor ladder. At the end of phase four, in one implementation, the MDAC output settles to the final value within an accuracy of 1.6 mV (1LSB).

Figure 7E:
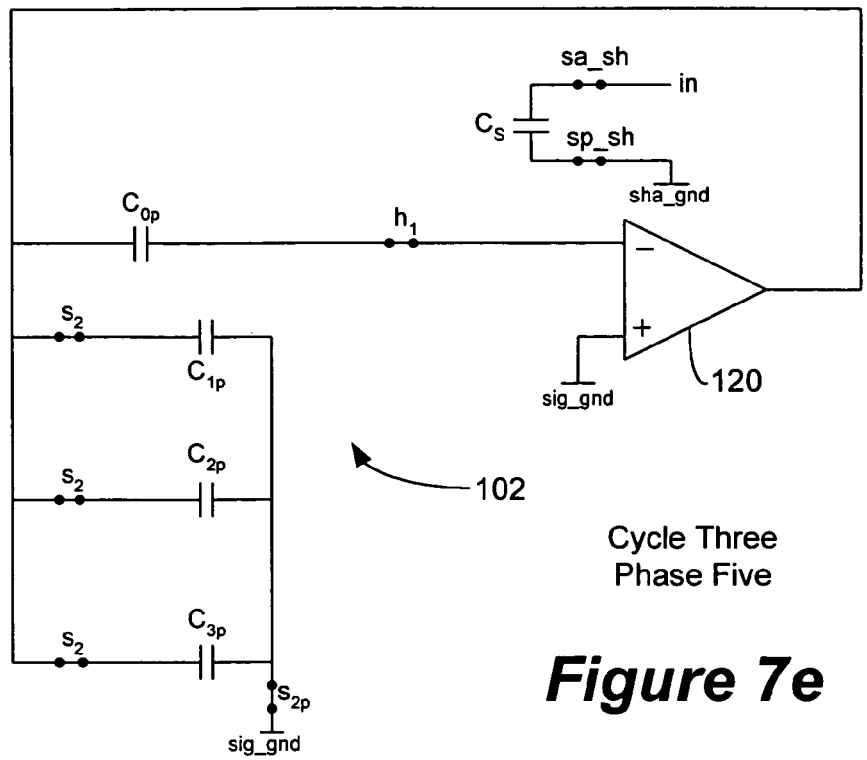
FIG. 7e is a diagram showing the configuration of the MDAC circuit of FIG. 5 during cycle three, phase five.

FIG. 7e depicts cycle three, phase five. In phase five, switches s2 are closed, and switches $q_{\{1,2,3\}\{p,z,m\}}$ opened to remove capacitors $C_{\{1,2,3\}p}$ from the reference voltages applied in the previous phase and couple capacitors $C_{\{1,2,3\}p}$ to the new residue voltage at the output of MDAC 102. Capacitor $C_{0p}$ is also coupled in the feedback loop around op amp 120 during phase five by the closure of switch $h_1$. Sampling capacitor $C_s$ begins to sample the input analog signal in via the closures of switches sa_sh and sp_sh. This operation occurs in the middle of phase five when switching activity is at its minimum so that the sample is free of any disturbances from the power rails. At the end of phase five, the second triplet of output bits $d_{\{0,1,2\}}^{II}$ are ready at the output of sub-ADC 104, as are feedback signals $q_{\{1,2,3\}\{p,z,m\}}$.

Figure 7F:
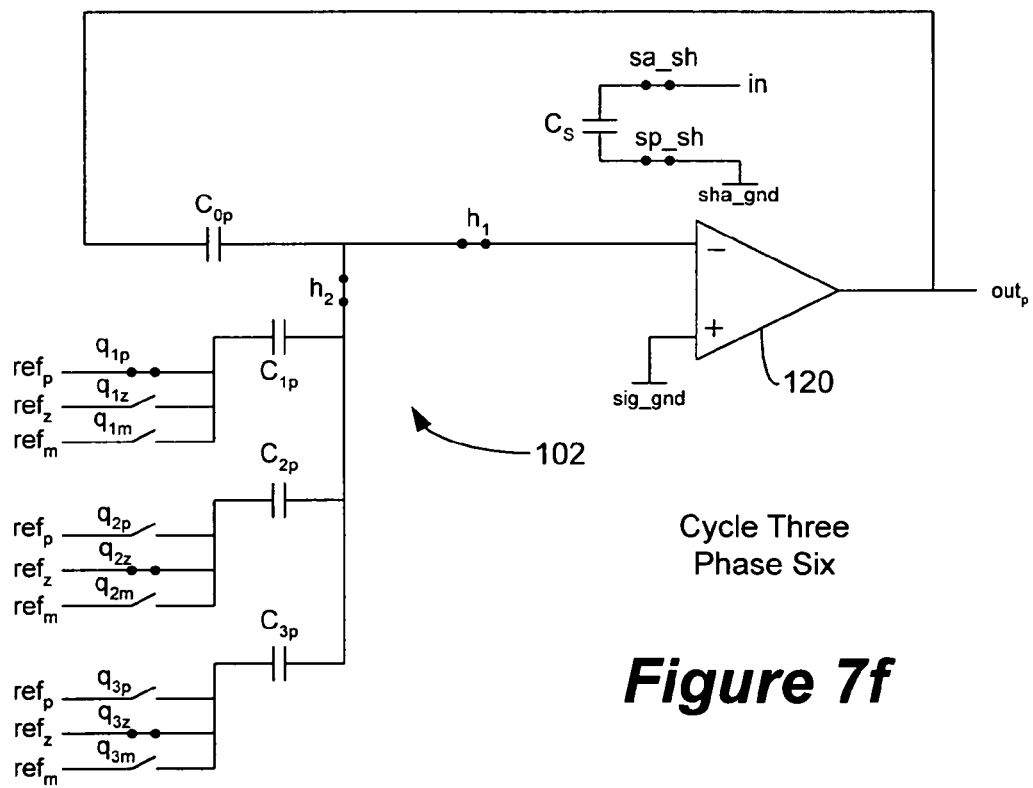
FIG. 7f is a diagram showing the configuration of the MDAC circuit of FIG. 5 during cycle three, phase six.

FIG. 7f depicts cycle three, phase six. Phase six is very similar to phase four, with the exception that the sampling capacitor $C_s$ is now actively sampling the input analog signal. The appropriate reference buffers $ref_{\{p,z,m\}}$ are coupled to capacitors $C_{\{1,2,3\}P}$ according to the feedback signals $q_{\{1,2,3\}\{p,z,m\}}$ generated in phase five. At the end of phase six, the MDAC output settles to the final value within an accuracy of 6.4 mV.

Figure 7G:
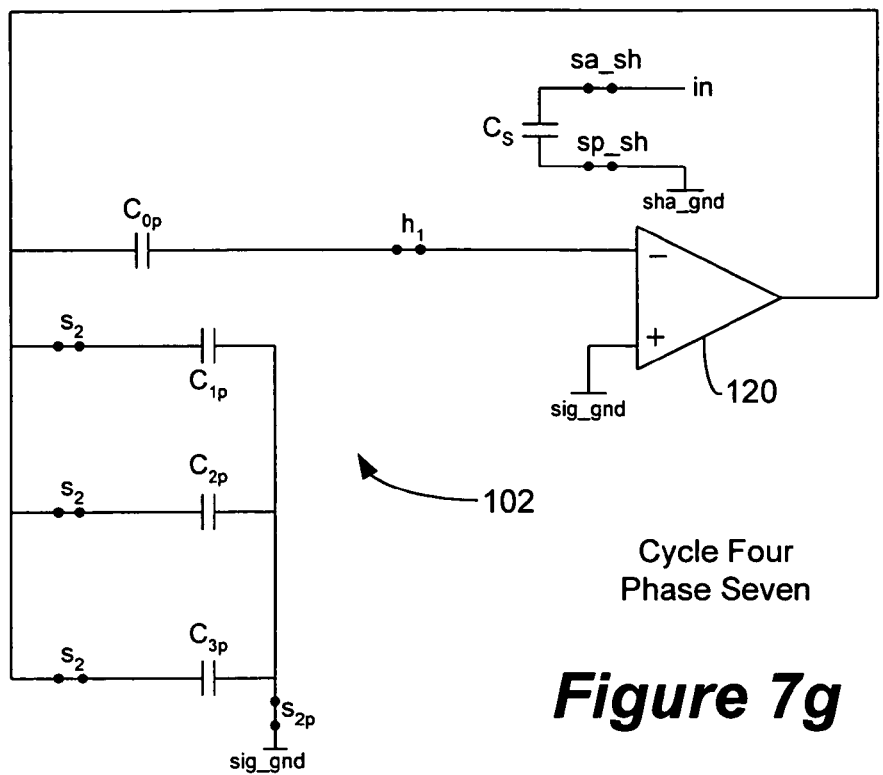
FIG. 7g is a diagram showing the configuration of the MDAC circuit of FIG. 5 during cycle four, phase seven.

FIG. 7g depicts cycle four, phase seven. This phase is identical in operation to phase five. Sampling capacitor $C_s$ continues to sample the input analog signal. Switches $s_2$ are closed, and switches $q_{\{1,2,3\}\{p,z,m\}}$ are opened, to remove capacitors $C_{\{1,2,3\}p}$ from the reference voltages applied in the previous phase and couple capacitors $C_{\{1,2,3\}p}$ to the new residue voltage at the output of MDAC 102. At the end of phase seven, the third triplet of output bits $d_{\{0,1,2\}}^{III}$ are ready at the output of sub-ADC 104, as are feedback signals $q_{\{1,2,3\}\{p,z,m\}}$.

Figure 7H:
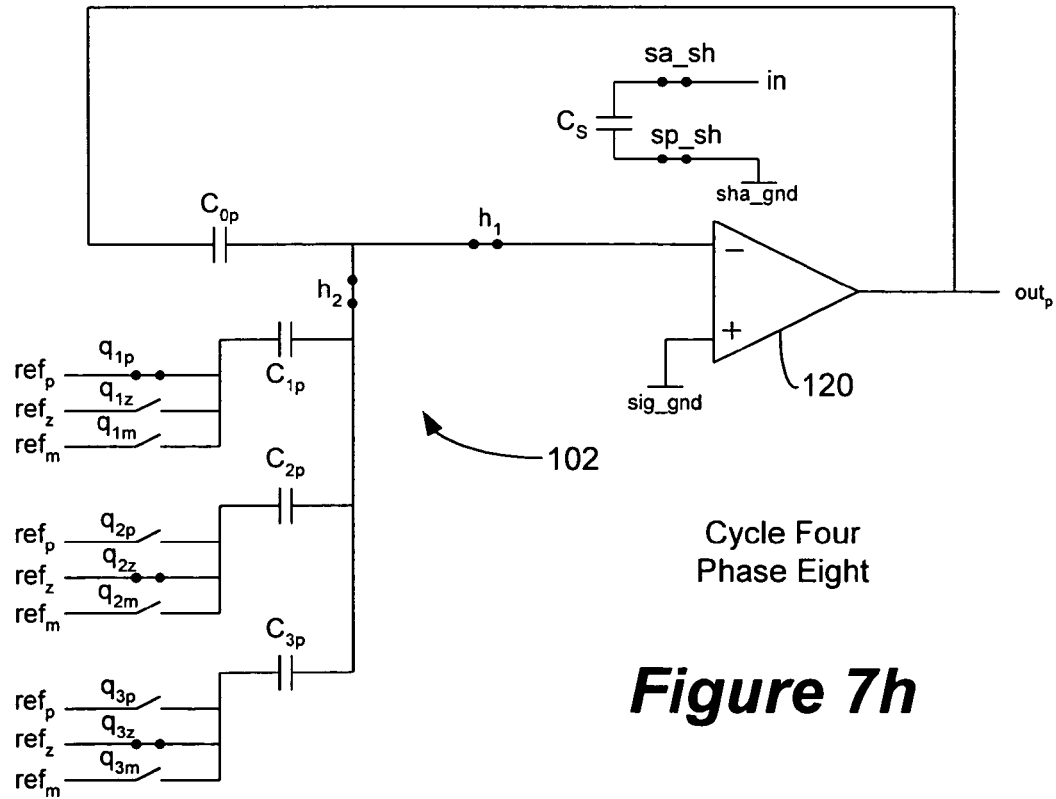
FIG. 7h is a diagram showing the configuration of the MDAC circuit of FIG. 5 during cycle four, phase eight.

FIG. 7h depicts cycle four, phase eight. This phase is identical in operation to phase six. Sampling capacitor $C_s$ continues to sample the input analog signal, and the appropriate reference buffers $ref_{\{p,z,m\}}$ are coupled to capacitors $C_{\{1,2,3\}p}$ according to the feedback signals $q_{\{1,2,3\}\{p,z,m\}}$ generated in phase seven. At the end of phase eight, the MDAC output settles to the final value within an accuracy of 25.6 mV.

Figure 7I:
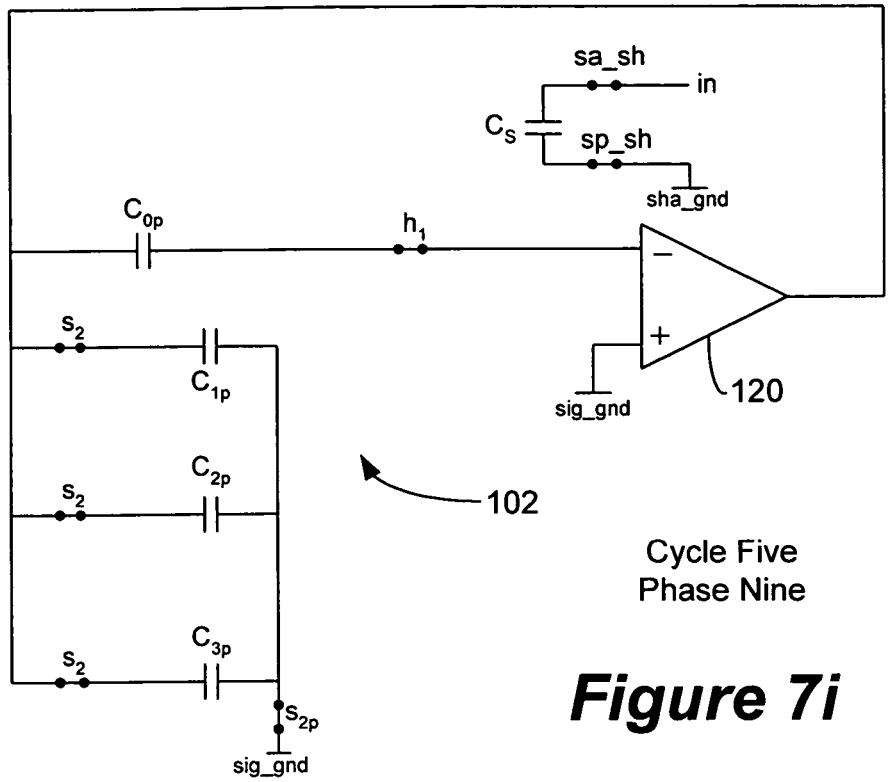
FIG. 7i is a diagram showing the configuration of the MDAC circuit of FIG. 5 during cycle five, phase nine.

FIG. 7i depicts cycle five, phase nine. This phase is identical in operation to phase seven. Sampling capacitor $C_s$ continues to sample the input analog signal. Switches $s_2$ are closed, and switches $q_{\{1,2,3\}\{p,z,m\}}$ are opened, to remove capacitors $C_{\{1,2,3\}p}$ from the reference voltages applied in the previous phase and couple capacitors $C_{\{1,2,3\}p}$ to the new residue voltage at the output of MDAC 102. At the end of phase seven, the fourth triplet of output bits $d_{\{0,1,2\}}^{IV}$ are ready at the output of sub-ADC 104, as are feedback signals $q_{\{1,2,3\}\{p,z,m\}}$.

Figure 7J:
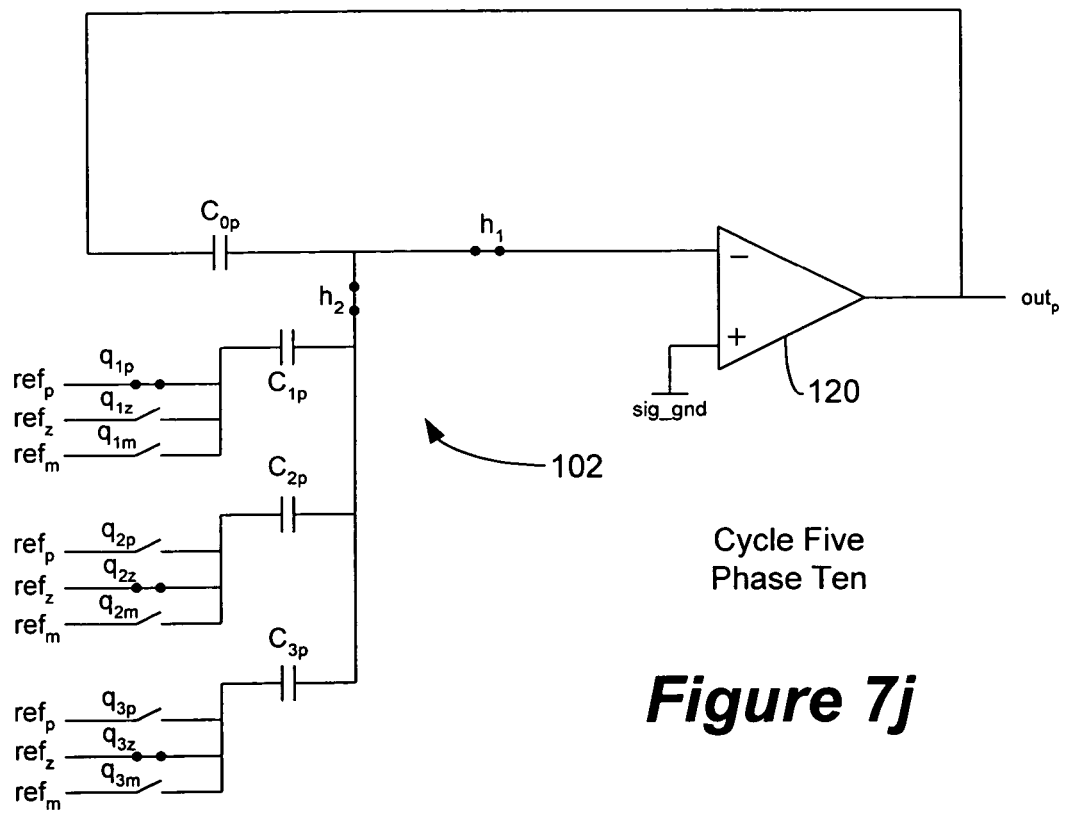
FIG. 7j is a diagram showing the configuration of the MDAC circuit of FIG. 5 during cycle five, phase 10.

FIG. 7j depicts cycle five, phase ten. The input signal is sampled onto $C_s$: the sp_sh switch closes, followed by the sa_sh switch. This operation occurs in the middle of phase ten when the switching activity is at its minimum so that the sample is free of any disturbances from the power rails. At the sampling instant, the sp_sh switch opens, leaving the top plate of $C_s$ floating (shd is also open). As the sp_sh switch is always connected to ground, the charge injected into Cs is constant. When the sa_sh switch opens, $C_s$ is disconnected from the input. The charge injection and the input voltage variation cause distortion to the voltage on $C_s$, but this distortion is not dangerous, as the sampled voltage is in the form of a charge and cannot be changed as there is no DC path to ground. In phase ten, the MDAC output must settle to the final value within an accuracy of 102.4 mV.

Figure 8:
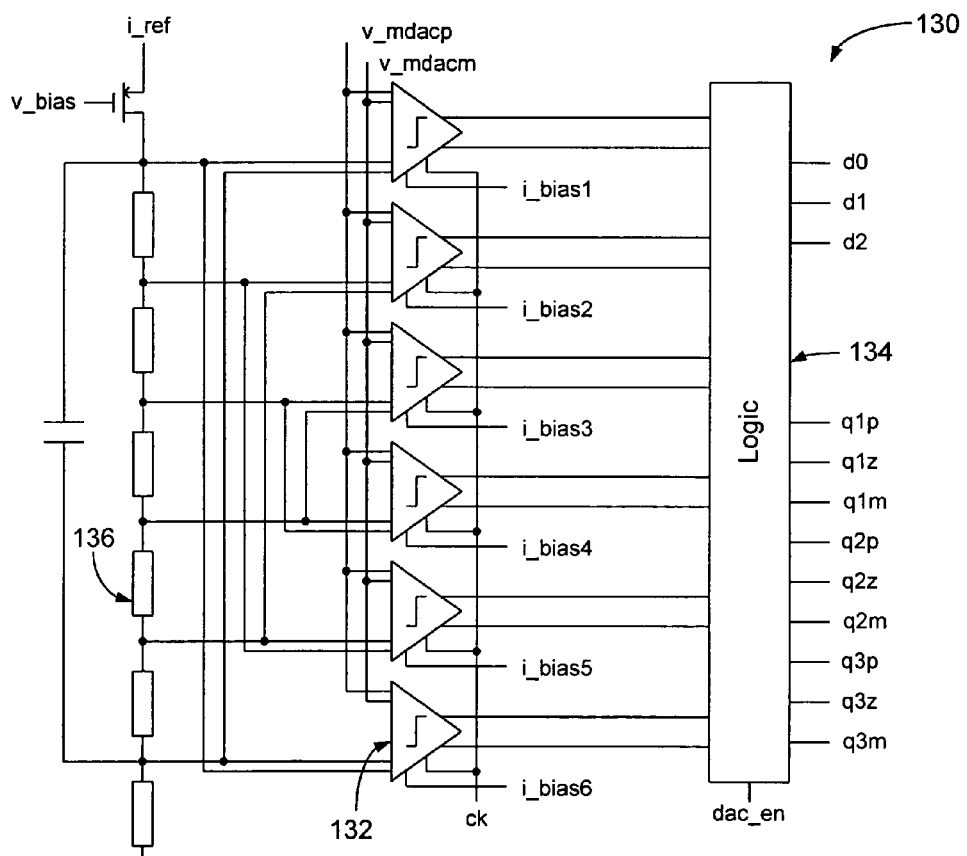
FIG. 8 is a block diagram of a sub-ADC according to the present invention.
Figures 9, 10:
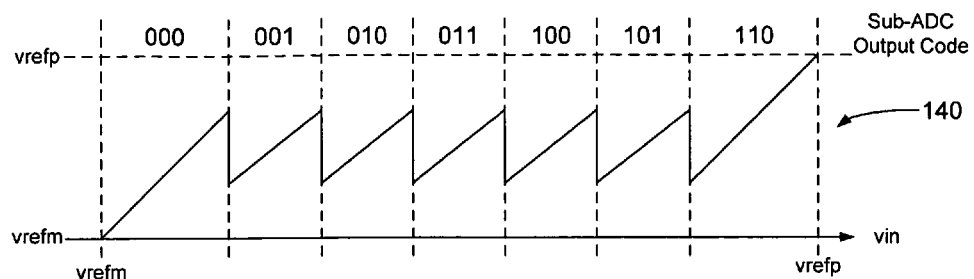
FIG. 9 is a diagram showing the transfer function of the sub-ADC of FIG. 8.
FIG. 10 is a table showing the relation between switch control signals and output bits generated by the sub-ADC of FIG. 8.

Sub-ADC 104 may be any type of low latency ADC. In one implementation, depicted in FIG. 8, the sub-ADC is a 2.5 bit sub-ADC 130 having a full-flash architecture to maximize the settling time of the MDAC output. As the operation of a full flash ADC is well known to those of skill in the art; it will be only briefly described herein. In order to relax the quantization accuracy specification for the sub- ADC, a digital correction algorithm is used. In one implementation, redundant sign digit coding (RSD) is used. Using one bit of redundancy in each cycle, only six comparators 132 and digital logic 134 are required. In one implementation, digital logic 134 comprises 3.3V digital logic. The effect of the RDS coding on the sub-ADC transfer function 140 is shown in FIG. 9.

The performance of flash ADC 130 is limited primarily by the accuracy of comparators 132 and secondarily by the accuracy of the reference voltage. Each of these can be modeled as an offset in the comparator threshold level. The amount of offset voltage that can be tolerated for each cycle when the RSD coding is employed is, in general:

$$V_{offset} = \pm \frac{r}{2^{n+R}} \cdot V_{ref},$$

where r is the number of redundancy bits per cycle, n is the effective cycle resolution and $V_{ref}$ is the reference voltage.

In one implementation, comparators 132 are implemented using an input sensing pre-amplifier followed by a regenerative latch. The offset voltage, generated by component mismatch and process parameter variations, is reduced by the pre-amplification and is further reduced by applying auto-zeroing techniques. The different reference voltage levels needed are implemented with a resistor string 136, which relies on the relative matching of the resistors. When RDS coding is applied, the matching requirements can easily be achieved without use of any high-precision components.

The thermometer code at the output of the comparators is converted into the binary output bits $d_{\{0,1,2\}}$, needed by the digital decoder, and the feedback signals $q_{\{1,2,3\}\{p,z,m\}}$, needed by MDAC 102, according to the table set forth in FIG. 10. The feedback signals are enabled during phases two, four, six and eight by a DAC_EN signal generated by a clock generator. Five triplets of output bits are level-shifted down and fed to decoder logic that builds the 11-bit output code, as described below. In one implementation, the three output bits are level-shifted down to 1.2V. The five triplets of output bits are added by the decoder logic according to the digital reconstruction algorithm set forth in FIG. 11, generating the final output bits b[10:0] of algorithmic ADC 100.

Figures 11, 12:
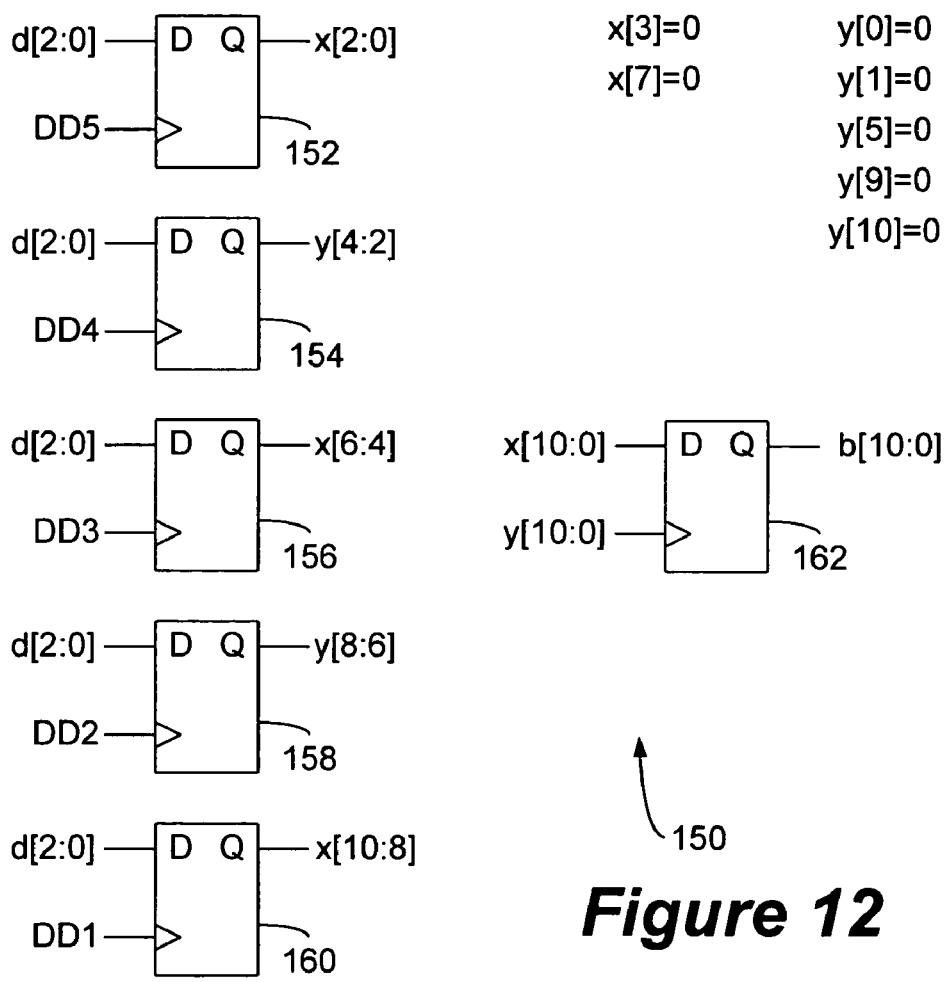
FIG. 11 depicts a digital reconstruction algorithm applied to the bits generated by the sub-ADC according to the present invention.
FIG. 12 is a block diagram of digital reconstruction logic implementing the algorithm of FIG. 11.
Figure 13:
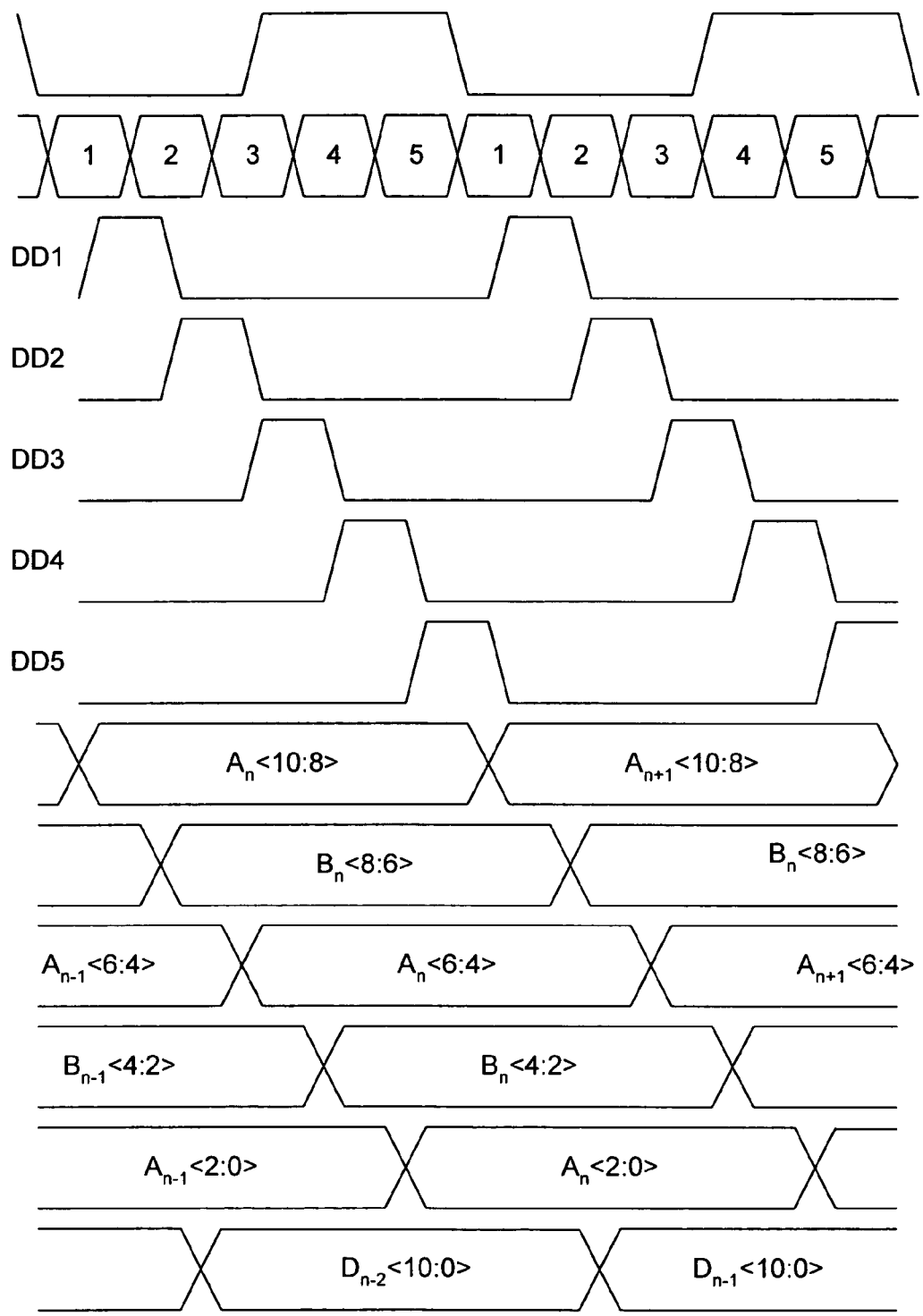
FIG. 13 is a timing diagram governing the operation of the digital reconstruction logic of FIG. 12.

Digital reconstruction logic or decoder 150 is illustrated in FIG. 12, and the timing for logic 150 is illustrated in FIG. 13 with reference to the DLL clock and ADC clock (five cycles per DLL clock period). Logic 150 comprises a finite state machine, synchronous with the DLL clock, that generates latch signals DD[5:1] to produce triplets of data x[2:0], y[4:2], x[6:4], y[8:6] and x[10:8] from elements 152, 154, 156, 158 and 160, wherein x[3], x[7], y[0], y[1], y[5], y[9] and y[10]=0. Ripple-carry full-adder 162 sums the five triplets of data (now in the form x[10:0] and y[10:0]) to produce the 11-bit digital output stream b[10:0].

Improved Clocking Scheme

As described above, the algorithmic ADC of the present invention uses an internal clock signal that is an integer multiple of the sampling rate. Analog-to-digital conversion is performed serially starting from the most significant bit (MSB) and proceeding toward the least significant bit (LSB). Between conversion steps, the internal analog residue voltage is amplified by $2^k$, where k is the number of bits resolved in one step. Because of this amplification factor, the accuracy that is needed is relaxed as the conversion proceeds.

To exploit this fact, the present invention provides a clocking scheme in which the internal (ADC) clock period is longer in the first steps (where the MSB is being resolved), providing more settling time for the internal switched capacitor circuitry. The accuracy needed in subsequent steps as the conversion proceeds toward the LSB is smaller, and hence, the analog signals do not need to settle as well. In view thereof, it is possible to shorten the clock period in later steps where not as much accuracy and settling time is needed. The length of each conversion step can be optimized to yield a shorter total conversion time without sacrifice of accuracy.

Figure 14:
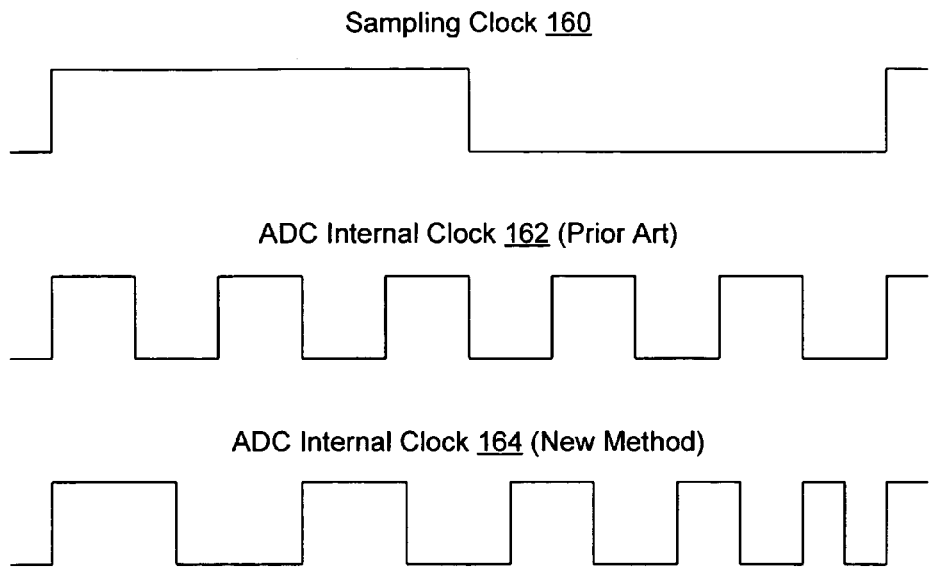
FIG. 14 is a timing diagram depicting an improved internal clocking scheme according to the present invention.

FIG. 14 sets forth an example wherein the internal clock rate 162 is five times the sampling clock rate 160. A new internal clock rate 164 is provided, still having five cycles, but with significantly longer cycles in the initial (MSB) steps relative to the cycle lengths in the final (LSB) steps. Using this principle, the sampling rate can be increased by 50% or more without loss of accuracy. Since it is the clock signal going into the ADC that is modified, minimal or no modifications to the ADC itself are necessary. Hence, the use of this improved clocking scheme extends to any algorithmic ADC having multiple internal clock cycles per sampling clock period. Of course, it may also be used in conjunction with the improved algorithmic ADC architecture described herein to enhance the advantages provided by that architecture.

Figure 15:
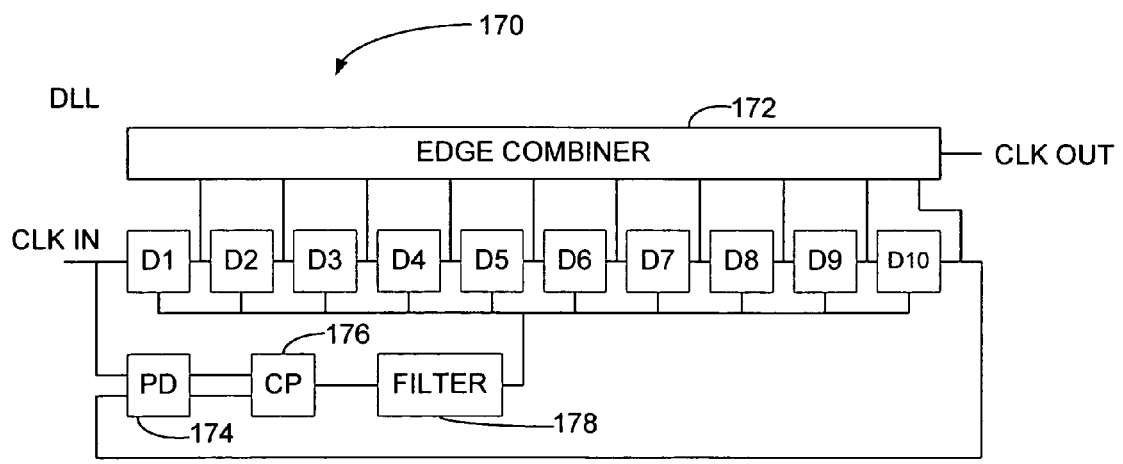
FIG. 15 is a block diagram of a DLL that generates the improved internal clocking scheme of FIG. 14.

In one implementation, as depicted in FIG. 15, the improved internal clock signal is produced using a delay-lock loop (DLL)-based clock multiplier 170. DLL 170 comprises a plurality of delay elements D1, ..., D10 having differing amounts of delay. The use of ten delay elements is for exemplary purposes only—any appropriate number of delay elements may be used. The normal (internal ADC) clock signal is propagated through the delay elements. The output of each delay element is provided to edge combiner 172, which combines the signals from each of the delay elements to form a new output clock signal. As is known to those skilled in DLL design, delay elements D1, ..., D10 also receive control signals from phase detector 174, charge pump 176 and loop filter 178.

In a typical DLL, identical delay elements are used in the voltage-controlled delay line. In the present invention, conversely, delay elements having differing amounts of delay are used in order to provide an output clock signal having a variable clock period (e.g., clock signal 164). In order to provide different delays for each element, unit elements may still be used, just different numbers of unit elements per delay.

The present invention provides numerous advantages and differences relative to previous algorithmic ADCs. The use of a single MDAC-based processing unit, rather than two units as in known algorithmic ADCs, makes the area very small. An extra clock phase is used to load the capacitors. In conventional algorithmic ADCs, by contrast, two MDACs operate in opposite phases—one generates a residue, which is sampled by the other one, and vice-versa. While the elimination of the other MDAC has a slight cost in increased conversion time, this penalty is offset by a faster settling time because the elimination of extra load capacitors (in the eliminated MDAC) makes the MDAC load smaller. Additionally, in the present invention, there is no immediate need for the result from the sub-ADC, because of the half clock cycle additional time from the moment when the sub-ADC is triggered and the moment that the result is needed by the MDAC.

Resolving multiple bits per conversion cycle yields a certain number of bits in fewer conversion cycles resulting in a higher conversion rate.

Integration of the sample-and-hold circuit with the MDAC (they share the same op amp) is another novelty of the present invention. Having a slower rate sample-and-hold circuit working in parallel with a faster rate ADC alleviates the task of a circuit driving the ADC, since the time that can be used to charge the sampling capacitor is not set by the internal clock rate of the ADC: it is set by the slower sample-and-hold clock rate. Furthermore, the sampling capacitor can be sized independently of the MDAC capacitors leading to a more optimal solution.

The provision of a variable internal clock period, dedicating more settling time to the first operation phases (i.e. close to the MSB) in which the accuracy requirement is highest, and less settling time to the latter operation phases (i.e. close to the LSB) in which the accuracy requirement is lowest, permits reduction of the total conversion time without degradation of overall accuracy.

While various embodiments of the invention have been described, it will be apparent to those of ordinary skill in the art that many more embodiments and implementations are possible that are within the scope of this invention.

What is claimed is:

1. An algorithmic analog-to-digital converter (ADC) comprising:
   a sample-and-hold circuit clocked by a sampling clock having a substantially uniform clock period; and
   an ADC processing unit clocked by a single internal ADC clock having at least two available cycles per sampling clock period, wherein at least one of the available cycles in the single internal ADC clock comprises a length different than a length of at least one of the other cycles in the single internal ADC clock.

2. An algorithmic ADC as claimed in claim 1, wherein the single internal ADC clock has at least one longer cycle producing a more accurate conversion and at least one shorter cycle producing a less accurate conversion.

3. A video encoder chip comprising an algorithmic ADC as claimed in claim 1.

4. A video decoder chip comprising an algorithmic ADC as claimed in claim 1.

5. A set top box comprising an algorithmic ADC as claimed in claim 1.

6. An electronic appliance comprising an algorithmic ADC as claimed in claim 1.

7. An algorithmic analog-to-digital converter (ADC) comprising:
   a sample-and-hold circuit clocked by a sampling clock having a substantially uniform clock period;
   an ADC processing unit clocked by an internal ADC clock having at least two available cycles per sampling clock period, wherein at least one of the available cycles comprises a length different than a length of at least one of the other cycles; and
   a DLL comprised of at least two delay elements having differing amounts of delay that are used to generate the internal ADC clock.

8. An algorithmic analog-to-digital converter (ADC) comprising:
   a sample-and-hold circuit clocked by a sampling clock having a substantially uniform clock period; and
   an ADC processing unit clocked by an internal ADC clock having at least two available cycles per sampling clock period, wherein at least one of the available cycles comprises a length different than a length of at least one of the other cycles,
   wherein the ADC processing unit comprises a multiplying digital-to-analog converter (MDAC) and a sub-ADC, and
   wherein the sample-and-hold circuit is integrated with the MDAC.

9. An algorithmic ADC as claimed in claim 8, wherein each internal ADC clock cycle is further sub-divided into at least two phases, wherein during at least one phase switchable capacitors are coupled to a residue or sampled voltage provided by the MDAC. and during one other phase the capacitors are coupled to a reference voltage.

10. A method for converting an input analog signal to an output digital bit stream, comprising:
    sampling and holding the input analog signal during a sampling clock period;
    generating at least two bits using an algorithmic ADC unit clocked by a single internal ADC clock having at least two cycles of variable length per sampling clock period.

11. A method as claimed in claim 10, wherein the single internal ADC clock has at least one longer cycle producing a more accurate conversion and at least one shorter cycle producing a less accurate conversion.

12. A method for converting an input analog signal to an output digital bit stream comprising:
    sampling and holding the input analog signal during a sampling clock period;
    generating at least two bits using an algorithmic ADC unit clocked by an internal ADC clock having at least two cycles of variable length per sampling clock period; and
    generating the internal ADC clock using a DLL comprised of delay elements having differing amounts of delay.

13. A method for reducing the conversion time of an algorithmic ADC comprising:
    providing a single internal ADC clock having at least two cycles of different lengths and generating a single internal ADC clock using a DLL comprised of delay elements having differing amounts of delay.

14. A method as claimed in claim 13, wherein the single internal ADC clock has cycles that are longer during operational phases proximate the MSB resolution and cycles that are shorter during operational phases proximate the LSB resolution.

15. A clock generation system for an algorithmic ADC comprising:
    means for generating a sampling clock; and
    means for generating an internal ADC clock having N cycles per sampling clack period, the cycles having variable length and being longer during operational phases proximate the MSB resolution and shorter during operational phases proximate the LSB resolution, wherein the means for generating an internal ADC clock comprises a DLL comprised of delay elements having differing amounts of delay.

16. A method for converting an input analog signal to an output digital bit stream, comprising:
    a step for sampling and holding the input analog signal during a sampling clock period;

a step for generating a single ADC clock having N cycles of variable length per sampling clock period, wherein at least one cycle within the single ADC clock has a different length than another cycle within the single ADC clock;

a step for generating an intermediate analog voltage per cycle using the sampled analog signal and residue voltages derived from the sampled analog signal;

a step for generating a set of data bits per cycle from the intermediate analog voltage;

a step for generating feedback signals for generating the intermediate analog voltage in the next cycle; and a step for generating the output digital bit stream using the N sets of data bits.

17. A method as claimed in claim 16, wherein each cycle is further divided into two phases, and wherein during a first phase a sampled analog signal or residue voltage is applied to switched capacitors, and wherein during a second phase reference voltages are applied to the switched capacitors.

18. A method as claimed in claim 17, wherein the feedback signals determine what reference voltages are applied to the switched capacitors.

19. A method as claimed in claim 16, wherein the ADC clock has longer cycles during operational phases requiring more accuracy and shorter cycles during operational phases requiring less accuracy.

* * * * *